US011605572B2

(12) United States Patent
Porwol et al.

(10) Patent No.: US 11,605,572 B2
(45) Date of Patent: Mar. 14, 2023

(54) ELECTRONIC COMPONENT WITH SEMICONDUCTOR DIE HAVING A LOW OHMIC PORTION WITH AN ACTIVE AREA AND A HIGH OHMIC PORTION ON A DIELECTRIC LAYER

(71) Applicant: Infineon Technologies AG, Neubiberg (DE)

(72) Inventors: Daniel Porwol, Straubing (DE); Thomas Fischer, Regensburg (DE); Uwe Seidel, Munich (DE); Anton Steltenpohl, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/237,143

(22) Filed: Apr. 22, 2021

(65) Prior Publication Data

US 2021/0335687 A1 Oct. 28, 2021

(30) Foreign Application Priority Data

Apr. 22, 2020 (DE) ......................... 102020110896.6

(51) Int. Cl.

| | |
|---|---|
| ***H01L 23/31*** | (2006.01) |
| ***H01L 21/683*** | (2006.01) |
| ***H01L 23/29*** | (2006.01) |
| *H01L 23/00* | (2006.01) |

(52) U.S. Cl.

CPC ...... *H01L 23/3164* (2013.01); *H01L 23/3121* (2013.01); *H01L 23/3135* (2013.01); *H01L 23/3192* (2013.01); *H01L 21/6836* (2013.01); *H01L 23/295* (2013.01); *H01L 24/02* (2013.01); *H01L 24/05* (2013.01); *H01L 24/13* (2013.01); *H01L 24/16* (2013.01); *H01L 24/32* (2013.01); *H01L 2221/68327* (2013.01); *H01L 2221/68368* (2013.01); *H01L 2224/02377* (2013.01); *H01L 2224/02381* (2013.01); *H01L 2224/05569* (2013.01); *H01L 2224/13024* (2013.01); *H01L 2224/16225* (2013.01); *H01L 2224/32225* (2013.01); *H01L 2924/1033* (2013.01); *H01L 2924/10252* (2013.01); *H01L 2924/10253* (2013.01); *H01L 2924/10254* (2013.01); *H01L 2924/10272* (2013.01); *H01L 2924/10329* (2013.01); *H01L 2924/10335* (2013.01)

(58) Field of Classification Search

CPC ................................................... H01L 23/3164

See application file for complete search history.

(56) References Cited

U.S. PATENT DOCUMENTS

| | | | | |
|---|---|---|---|---|
| 2004/0017668 | A1 | 1/2004 | Siegel et al. | |
| 2009/0155984 | A1 | 6/2009 | Kim et al. | |
| 2010/0046188 | A1 | 2/2010 | Bayan et al. | |
| 2011/0298126 | A1 | 12/2011 | Tsai et al. | |
| 2015/0147869 | A1 | 5/2015 | La et al. | |
| 2017/0330785 | A1 | 11/2017 | Kimura et al. | |
| 2018/0076174 | A1 * | 3/2018 | Costa | H01L 23/3135 |

* cited by examiner

*Primary Examiner* — William A Harriston

(74) *Attorney, Agent, or Firm* — Murphy, Bilak & Homiller, PLLC

(57) ABSTRACT

An electronic component includes a mold layer and a semiconductor die including a low ohmic first portion and a high ohmic second portion. The low ohmic first portion has an active area. The high ohmic second portion is arranged on the mold layer.

23 Claims, 3 Drawing Sheets

120 122 140 106 104 148 100 144 102 142 143 110 131 133 145 111 145 124 141 145

100
133
131
111
146
143
142
140
144
141
110
104
d1
D
B
L
d2
102
135
152
150
106
137
154

111
140
141
148
143
110
142
144
130
104
153

140
141
148
138
132
143
110
142
144
130
104
153
111

153
144
B
104
142
155
140
130
143
148
D
d2
d1
110
L
132
111
138
141

ELECTRONIC COMPONENT WITH SEMICONDUCTOR DIE HAVING A LOW OHMIC PORTION WITH AN ACTIVE AREA AND A HIGH OHMIC PORTION ON A DIELECTRIC LAYER

TECHNICAL FIELD

Various embodiments relate generally to an electronic component, a package, and a method of manufacturing electronic components.

BACKGROUND

Packages may be denoted as encapsulated electronic components with electrical connections extending out of the encapsulant and being mountable to an electronic periphery, for instance on a printed circuit board.

Packaging cost is an important driver for the industry. Related with this are performance, dimensions and reliability. The different packaging solutions are manifold and have to address the needs of the application.

SUMMARY

There may be a need to provide a possibility to manufacture electronic components with the focus to reduce processing complexity while maintaining high device reliability.

According to an exemplary embodiment, an electronic component is provided which comprises a mold layer and a semiconductor die comprising a low ohmic first portion and a high ohmic second portion, wherein the first portion has an active area and the second portion is arranged on the mold layer.

According to another exemplary embodiment, a package is provided which comprises an electronic component comprising a dielectric layer and a semiconductor die comprising a low ohmic first portion and a high ohmic second portion, wherein the first portion has an active area and the second portion is arranged on the dielectric layer, and an encapsulant encapsulating at least part of the electronic component.

According to still another exemplary embodiment, a method of manufacturing electronic components is provided, wherein the method comprises providing a semiconductor wafer comprising a plurality of semiconductor dies each comprising a low ohmic first portion and a high ohmic second portion, wherein each of the first portions has an active area, arranging the second portions on a mold layer, and thereafter separating the semiconductor wafer on the mold layer into a plurality of separate electronic components each comprising at least one of the semiconductor dies and a portion of the mold layer.

According to an exemplary embodiment, an electronic component and a corresponding package may be provided in which a semiconductor die is equipped with a low (or lower) ohmic portion and a high (or higher) ohmic portion. Advantageously, the high ohmic portion may be (preferably directly) connected with a (preferably substantially planar or flat) dielectric (preferably mold) layer, whereas the low ohmic portion with an active chip area may face away from said dielectric layer. With this configuration, a highly compact electronic component and package may be manufactured, since both the semiconductor die as well as the dielectric layer may be manufactured very thin. The ohmic losses during operation of the electronic component of package may also be low, since integrated circuit element(s) may be arranged in the low ohmic portion only. The high ohmic portion may provide support during manufacture, may simplify handling and may be partially removed by thinning before completing manufacture of the electronic component or the package. At the same time, a simple electric connection of the active area is possible while the dielectric layer may serve as a support. By using a simple dielectric layer (in particular a mold layer) as support, the effort of manufacturing and singularizing electronic components may be significantly reduced. Furthermore, a reliable device-to-device isolation as well as an improved high frequency performance may be achieved with such a concept.

In the following, further exemplary embodiments of the electronic component, the package and the method will be explained.

In the context of the present application, the term "electronic component" may in particular encompass a semiconductor die (in particular a power semiconductor die), an active electronic device (such as a transistor), a passive electronic device (such as a capacitance or an inductance or an ohmic resistance), a sensor (such as a microphone, a light sensor or a gas sensor), a light emitting, semiconductor-based device (such as a light emitting diode (LED) or LASER), an actuator (for instance a loudspeaker), and a microelectromechanical system (MEMS). In particular, the electronic component may comprise a semiconductor die having at least one integrated circuit element (such as a diode or a transistor) in a surface portion thereof.

In the context of the present application, the term "semiconductor die" may particularly denote a naked piece of semiconductor material, which may comprise also electrically insulating structures and electrically conductive structures in the semiconductor material, and which may have at least one integrated circuit element monolithically integrated in the semiconductor material. A semiconductor die may hence be a small block of semiconducting material on which a given functional circuit is fabricated. Such integrated circuits may be produced in large batches on a single semiconductor wafer, for instance using processes such as photolithography. The processed semiconductor wafer may then be separated into many pieces, each containing one copy of the circuit. Each of these pieces may be denoted as a semiconductor die. Semiconductor dies implemented according to exemplary embodiments may be formed in silicon technology, gallium nitride technology, silicon carbide technology, etc.

In the context of the present application, the terms "low ohmic semiconductor portion" and "high ohmic semiconductor portion" may particularly denote different integrally connected portions of a semiconductor die having different values of electric conductivity. More specifically, the low ohmic semiconductor portion may have a higher value of the electric conductivity than the high ohmic semiconductor portion. For instance, the low ohmic semiconductor portion may be a crystalline semiconductor (in particular silicon) portion, whereas the high ohmic semiconductor portion may be a high resistance semiconductor (in particular silicon) portion. In one embodiment, the low ohmic semiconductor portion and the high ohmic semiconductor portion may be separated by a dielectric layer in between. In such embodiments, the semiconductor die may be embodied as an SOI (silicon-on-insulator) die.

In the context of the present application, the term "active area" may particularly denote a section of the semiconductor die in which at least one integrated circuit element (for instance a transistor, a diode, etc.) is monolithically integrated.

In the context of the present application, the term "dielectric layer" may particularly denote a flat or sheet-line body made of an electrically insulating material. For instance, such a dielectric material may be a mold compound or another dielectric such as a polymer.

In the context of the present application, the term "mold layer" may particularly denote a flat or sheet-like body made of a mold or a mold compound material. For instance, the mold may comprise or consist of a resin, for instance an epoxy resin. It is also possible that the mold comprises such a resin, and additionally filler particles in the resin matrix.

In the context of the present application, the term "package" may particularly denote an electronic device which may comprise one or more electronic components, preferably mounted on a carrier (wherein said carrier may comprise or consist of a single part, multiple parts joined via encapsulation or other package components, or a subassembly of carriers). Said constituent(s) of the package may be encapsulated at least partially by an encapsulant. Optionally, one or more electrically conductive interconnect bodies (such as bond wires and/or clips) may be implemented in a package, for instance for electrically coupling the electronic component with the carrier.

In the context of the present application, the term "encapsulant" may particularly denote a substantially electrically insulating material surrounding at least part of an electronic component (and optionally at least part of a carrier) to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity.

In an embodiment of the package, the dielectric layer is a mold layer (in particular a mold foil) or a curable layer (in particular a temperature curable layer).

In an embodiment, the mold layer comprises or consists of a mold foil. When embodied as a foil, the mold layer may be bendable and may only contribute to a very minor extent to the thickness of the electronic component and the package. For instance, a mold foil may have a thickness in the range from 2 μm to 200 μm.

In an embodiment, the mold layer comprises or consists of a mold plate. A mold plate may provide more robustness but may also have a higher thickness. For instance, a mold plate may be rigid and may have a thickness in the range from 250 μm to 1 mm.

In an embodiment, the mold layer is a double mold layer (i.e. having exactly two layers of mold material, which may be interconnected), for instance may comprise or consist of a mold plate and a mold foil. A corresponding material selection of the double mold layer may allow to fine-tune the properties of the electronic component in the package.

In an embodiment, the mold layer comprises a resin matrix, in particular made of epoxy resin, and filler particles, in particular made of metal oxide, in the resin matrix. The matrix material may be curable. The filler particles may be used for adjusting the physical properties (such as thermal conductivity, electrical insulation, coefficient of thermal expansion, high-frequency properties, etc.) of the mold material.

In an embodiment, the active area has at least one integrated circuit element. The one or more circuit elements may be monolithically integrated in the (preferably low ohmic portion of the) semiconductor die. At least one electrically conductive pad of a back end of line (BEOL) structure may be an exposed electrically conductive area coupled with the at least one integrated circuit element of the active area for connecting the electronic component to an external electronic periphery.

In an embodiment, the electronic component comprises an adhesive layer between the mold layer and the semiconductor die. Said adhesive layer may inhibit undesired delamination of the electronic component and the package.

In an embodiment, the active area has a thickness of less than 1 μm, in particular in a range from 50 nm to 500 nm, more particularly in a range from 100 nm to 200 nm. Thus, the partial volume processed by semiconductor technology may be extremely small.

In an embodiment, the semiconductor die is substantially free of unprocessed semiconductor material. This may render the electronic component and the package highly compact, since substantially the entire semiconductor material over the full thickness of the semiconductor die may contribute to the formation of functional integrated circuit elements.

In another embodiment, the semiconductor die has unprocessed semiconductor material with a thickness of less than 150 μm, in particular less than 30 μm. With such a small thickness, the configuration of the electronic component and the package may be still very compact. However, keeping some unprocessed semiconductor material may avoid the danger of unintentionally damaging the active area of the semiconductor die during thinning of a wafer during production.

In an embodiment, the semiconductor die has a thickness in a range from 1 μm to 200 μm, in particular in a range from 10 μm to 40 μm, more particularly in a range from 20 μm to 30 μm. In particular, very thin semiconductor dies may be used, for instance having a thickness of less than 50 μm, preferably in a range from 20 μm to 30 μm. If the thickness is even significantly smaller than 20 μm, heat removal may become more difficult. If the thickness becomes significantly larger than 30 μm, the electrical influence of the semiconductor material (in particular silicon material) may become larger.

In an embodiment, the high ohmic second portion of the semiconductor die is made of a high resistance semiconductor material, in particular a semiconductor material having an electric resistivity of at least 500 Ωcm, in particular at least 1000 Ωcm. Advantageously, such a high ohmic semiconductor can be provided with low effort. Thus, a more costly low ohmic semiconductor portion (for instance made of crystalline silicon) may be limited substantially to the extension of the active area to keep the manufacturing effort low. High ohmic semiconductor material fulfilling a support function and simplifying handling of a semiconductor wafer may later be removed partially by thinning anyway, so that its higher resistance does not compromise performance and reliability of the electronic component of the package as a whole. For example, the low ohmic semiconductor portion may have an electric resistivity of less than 100 Ωcm, in particular less than 10 Ωcm. For instance, the electric resistivity of the low ohmic semiconductor portion may be in a range from 1 Ωcm to 100 Ωcm, in particular in a range from 1 Ωcm to 10 Ωcm.

In an embodiment, the semiconductor die is a Silicon-On-Insulator (SOI) die. Silicon-On-Insulator (SOI) technology may be used for the fabrication of silicon semiconductor devices in a layered silicon-insulator-silicon substrate, to reduce parasitic capacitance within the device, thereby improving performance. SOI-based semiconductor dies have the specific property that the silicon junction may be arranged above an electrical insulator, such as silicon dioxide. Alternatively, an electrical insulator of a base used for manufacturing electronic components and packages according to exemplary embodiments may be made of another dielectric material such as sapphire, so that the semiconductor die according to such embodiments may be denoted as silicon on sapphire die. The choice of an appropriate insulator may be made in accordance with an intended application. For instance, sapphire may be a proper choice for radio frequency (RF) applications.

In an embodiment, the electronic component comprises an electrically conductive back end of line (BEOL) structure on a main surface of the semiconductor die opposing another main surface of the semiconductor die on the mold layer. The BEOL may be a portion of the manufacture of integrated circuits where the individual integrated circuit elements (such as transistors, capacitors, etc.) get interconnected with wiring on the wafer, i.e. the metallization layer (for instance using copper, aluminum, etc.). BEOL may be considered to begin when the first layer of metal is deposited on the wafer. Thus, the BEOL structure may be directly connected to the active area of the semiconductor die. The mentioned BEOL structure may include at least one of the group consisting of one or more pads, contacts, insulating layers, metal levels, and bonding sites for die-to-package connections. The semiconductor die may be sandwiched between the dielectric layer or the mold layer on one side and the BEOL structure on the other side.

In an embodiment, the electronic component comprises at least one electrically conductive protrusion protruding beyond the BEOL structure. Such a protrusion may comprise for instance a pillar, a post, a bump, a ball, etc., protruding beyond a flat base of the BEOL structure. Such a protrusion may be configured for promoting a solder connection of the electronic component when forming the basis of a package (which may have a carrier for carrying the electronic component with a solder connection in between) or when being mounted (and soldered) on a mounting base such as a printed circuit board. In one embodiment, the protrusion may have a low ohmic base structure with a solder cap on top thereof.

In an embodiment, the semiconductor die is an active semiconductor die, in particular a high frequency semiconductor die. A semiconductor die configured for providing a power gain may be an active semiconductor die. Such an active semiconductor die may inject power to an electric circuit to which it belongs and can control the electric current flow within the circuit. Examples for active semiconductor dies are transistor dies, rectifier dies or thyristor dies. In terms of high-frequency technology, the semiconductor die may for instance be configured to operate in a frequency range from around 20 kHz to around 300 GHz.

In an embodiment, the mold layer in the electronic component or package is already fully cured and is made of a material which has adhesive properties in an uncured state. For instance, curing may denote polymerization and/or cross-linking of material of the mold layer, more specifically of a resin thereof (for instance an epoxy resin). Before curing, the mold layer may be sticky and may thereby properly attach to the semiconductor die or a semiconductor wafer. After curing, which may be triggered for instance by supplying thermal energy to the mold layer, the polymerization or cross-linking may result in the formation of an intrinsic connection between mold layer and semiconductor die(s), wherein the sticky property at the exterior surface of the mold layer may be lost upon curing.

In an embodiment, the package comprises a carrier being partially encapsulated by the encapsulant and being electrically connected with the electronic component. In the context of the present application, the term "carrier" may particularly denote a support structure (which may be at least partially electrically conductive) which serves as a mechanical support for one or more electronic components to be mounted thereon, and which may also contribute to the electric interconnection between the die(s) and the periphery of the package. In other words, the carrier may fulfil a mechanical support function and an electric connection function. A carrier may comprise or consist of a single part, multiple parts joined via encapsulation or other package components, or a subassembly of carriers.

For instance, the carrier may be a leadframe-type carrier, i.e. a structured metallic plate. When the carrier forms part of a leadframe, it may comprise a die pad and one or more leads.

In another embodiment, the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may also be embodied as a Direct Copper Bonding (DCB) substrate or a Direct Aluminium Bonding (DAB) substrate.

In particular, the above described BEOL structure on a main surface of the semiconductor die may be electrically connected to the at least partially electrically conductive carrier. Thus, the connection between the BEOL structure and the carrier may simultaneously provide both a mechanical connection between electronic component and carrier as well as an electric coupling in between.

In an embodiment, the encapsulant is a mold compound, in particular having different material properties than the dielectric layer. By selecting different materials for the mold layer of the electronic component and the encapsulant of the package, a specific adaptation of required properties (supporting the semiconductor dies during processing on component level, reliably mechanically protecting and electrically decoupling on package level) may be individually adjusted for the two mold structures.

A mold compound may comprise a matrix of flowable and hardenable material and filler particles embedded therein. For instance, filler particles may be used to adjust the properties of the mold component, in particular to enhance thermal conductivity. For instance, molding may be accomplished by injection molding, transfer molding or compression molding.

In an embodiment, said encapsulating may be an overmolding of a respective electronic component by an encapsulant after separation from a wafer. However, one or more electric contacts for accessing the encapsulated semiconductor die from an exterior of the package may remain exposed. Such contacts may relate to an electrically conductive carrier on which an electronic component may be mounted in an interior of the package.

In an embodiment, the method comprises temporarily connecting a carrier wafer to the semiconductor wafer before the arranging, and removing the carrier wafer from the semiconductor wafer before the separating. For instance, such a temporary carrier wafer may be a glass plate which may be re-used multiple times.

In an embodiment, the method comprises thinning the semiconductor wafer before connecting the semiconductor wafer on the mold layer, in particular by removing material at least of or exclusively of the second portions. For instance, thinning may be accomplished mechanically by grinding, by laser ablation and/or chemically (for instance by wet etching). It is also possible that at least two of the mentioned and/or other thinning technologies may be combined.

In an embodiment, the method comprises temporarily connecting a dicing foil to the mold layer before or after the arranging, and removing the dicing foil from the electronic components during or after the separating. A dicing foil or dicing tape may be a foil or tape used during wafer dicing, i.e. the separation of pieces of semiconductor material following processing on wafer level. The dicing foil may hold the semiconductor dies together during the separation or singularization process. The dicing foil may be mounted to a thin frame (for instance made of a metal) for the purpose of stability. The separated semiconductor dies may then be removed from the dicing tape, for instance by a pick and place tool. The singularized semiconductor dies with a mold layer on one side thereof may then be further processed, for instance may be assembled to a mounting base and/or may be encapsulated in terms of packaging.

In an embodiment, the method comprises embedding electrically conductive protrusions on an electrically conductive back end of line (BEOL) structure on a main surface of the semiconductor wafer in a temporary (i.e. later removed) adhesive structure, which in particular connects the semiconductor wafer with a carrier wafer. The temporary adhesive structure may temporarily connect the carrier wafer with the semiconductor wafer and may be sufficiently soft to temporarily accommodate the protrusions without the risk of damage. Before singularization, the temporary adhesive structure may be removed from the electronic components, preferably without residues remaining at the electronic components.

In an embodiment, the method comprises separating by at least one of the group consisting of mechanically sawing, laser sawing and etching. These separation techniques may also be combined.

In an embodiment, the semiconductor die is configured as a power semiconductor die. Thus, the semiconductor die may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide or gallium nitride). A semiconductor power die or chip may comprise one or more field effect transistors, diodes, inverter circuits, half-bridges, full-bridges, drivers, logic circuits, further devices, etc.

As substrate or wafer forming the basis of the semiconductor dies, a semiconductor substrate, preferably a silicon substrate, may be used. It is also possible to implement a germanium substrate or a III-V-semiconductor material. For instance, exemplary embodiments may be implemented in gallium nitride or silicon carbide technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
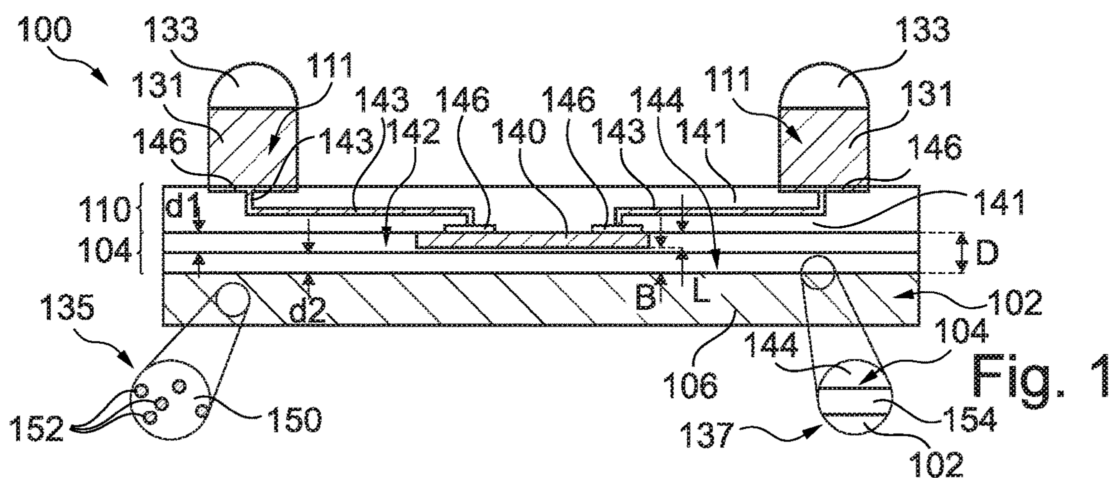
FIG. 1 illustrates a cross-sectional view of an electronic component according to an exemplary embodiment.

The illustration in the drawing is schematically and not to scale.

Before exemplary embodiments will be described in more detail referring to the figures, some general considerations will be summarized based on which exemplary embodiments have been developed.

According to an exemplary embodiment, an electronic component, a package and a method of manufacturing of a semiconductor component are provided, which may operate preferably based on thin wafer technology. The monolithically integrated circuit element(s) of an active area of the semiconductor component may be arranged in a low ohmic portion of a semiconductor wafer or die. The low ohmic silicon portion may be placed on a high ohmic silicon portion. High ohmic silicon (for instance having a specific resistivity of about 1 kOhmcm) is of utmost advantage at very high frequencies for instance in the GHz regime, where high ohmic silicon may be essentially transparent.

Linearity and low losses are important performance factors in high performance RF (radio frequency) circuits.

However, performance limitations may result from active and passive integrated circuit elements and the capacitive and inductive interaction of these circuit elements and traces with the semiconductor substrate. Therefore, some components require removing or significantly thinning the substrate. For this purpose, carrier technologies may be used to stabilize the thin wafers and chips.

According to an exemplary embodiments, an expensive carrier may be dispensable, and a reduction of the manufacturing effort may thus be achieved. In particular, an electronic component or a package according to an exemplary embodiment may comprise a semiconductor die (for instance an active RF semiconductor die) that has little or thin unprocessed high ohmic silicon on the back size, or even substantially no such silicon. For instance, a corresponding naked semiconductor die may be equipped with a back end of line (BEOL) metallization structure with contact connections to the top side. In addition, it may be possible to provide bumps or pillars (for instance made of copper) or balls on the BEOL structure.

An exemplary embodiment may also provide a dielectric (in particular mold) layer or back side protection film at the back side of the electronic component. Such a dielectric layer may stabilize the electronic components or a wafer as a preform thereof. This dielectric layer or film may be preferably made of a mold-like material with adhesive properties.

Such a structure can be used advantageously in a simple and cost-effective separation process, as only a thin device with a thin mold film has to be isolated here. For singularization, simple separation methods can thus be used.

Advantageously, exemplary embodiments may render thick permanent glass plates dispensable, since it may for instance be sufficient to attach a mold layer or film directly or indirectly to a semiconductor die.

Thus, an exemplary embodiment may use a composite of semiconductor die and mold layer, the latter functioning as an isolation carrier. The opportunity to omit a conventional bulky carrier wafer made of glass, silicon or ceramic may reduce the dimensions of the electronic components and the manufacturing effort. In particular, a high sawing effort for singularization of the semiconductor dies or chips may be dispensable as well. This may allow to achieve an improved device-to-device isolation and an improved RF performance, while simultaneously keeping the manufacturing process simple.

Exemplary embodiments may provide an electronic component without free charge carriers outside the active chip range, which might contribute to non-linearities, losses and/or isolation limits. Exemplary embodiments may hence be highly appropriate for high-performance RF devices, RF switches, LNA (low noise amplifier) devices and millimeter-wave devices.

Replacing a conventional insulation substrate with a mold or mold-like film or layer may reduce the dimensions of the electronic components and the manufacturing effort. In a corresponding electronic component, the backside of the semiconductor die or chip may be covered with a film of mold compound or a plastic material or plastic composite. An obtained electronic component can be used as a chip scale package without further processing with package technologies. However, it is also possible to package an obtained electronic component, for instance by encapsulation.

FIG. 1 illustrates a cross-sectional view of an electronic component 100 according to an exemplary embodiment.

The illustrated electronic component 100 comprises a film-shaped mold layer 102 as a base. Thus, mold layer 102 is here embodied as a mold foil 106. A naked semiconductor die 104 is attached on top of the mold foil 106. The semiconductor die 104 may for instance be a silicon chip and may comprise a low or lower ohmic first portion 142 and a high or higher ohmic second portion 144. For instance, the low(er) ohmic first portion 142 may be made of crystalline silicon. In contrast to this, the higher) ohmic second portion 144 may for instance be made of high resistance silicon. For instance, the high ohmic second portion 144 may have an electric resistivity of 1 kΩcm. In contrast to this, the low ohmic first portion 142 may have a significantly lower electric resistivity, for instance 10 Ωcm.

As shown, the first portion 142 has an active area 140 in which one or multiple integrated circuit elements may be monolithically integrated (not shown in FIG. 1). Such integrated circuit elements may for example be field-effect transistors or diodes, for instance when the semiconductor die 104 is configured for power semiconductor applications. In particular, the semiconductor die 104 may be an active semiconductor die 104 and may be configured for high frequency applications.

The second portion 144 may be directly connected to the mold layer 102. However, as shown in a detail 137, it is also possible that an adhesive layer 154 is arranged between the mold layer 102 and the second portion 144 of the semiconductor die 104. As can be taken from detail 137, the adhesive layer 154 may be sandwiched between the mold layer 102 and the semiconductor die 104 for further promoting adhesion between mold layer 102 and the naked semiconductor die 104.

No monolithically integrated circuit elements are formed in the second portion 144, which may therefore be free of an active area.

The second portion 144, in combination with a part of the first portion 142 directly connected to the second portion 144 thus constitutes unprocessed semiconductor material with a thickness B of for example slightly less than 25 μm. An entire thickness D of the semiconductor die 104 may be for example 25 μm. A thickness L of the active area 140 in the low ohmic first portion 142 may be D–B. More specifically, the active area 140 may for example have a thickness L of less than 1 μm, for instance 150 nm. A vertical thickness d2 of the second portion 144 may be larger than a vertical thickness d1 of the first portion 142. For instance, d2 may be at least 10 times of d1. The illustration of FIG. 1 is thus not true to scale.

On its front side, the electronic component 100 comprises a layer-shaped electrically conductive back end of line (BEOL) structure 110. The BEOL structure 110 may function as a redistribution layer and comprises one or more electrically insulating layers 141 with electrically conductive traces 143 thereon and/or therein. In particular, the BEOL structure 110 may comprise pads 146. The BEOL structure 110 may be formed directly on an upper main surface of the semiconductor die 104. Said upper main surface is arranged opposing to a lower main surface of the semiconductor die 104 which may be in direct physical contact with the mold layer 102, or which may be separated from the mold layer 102 only by adhesive layer 154. Said BEOL structure 110 may be directly connected to an active side, i.e. the active area 140, of the semiconductor die 104.

As shown, electrically conductive protrusions 111 protrude beyond the BEOL structure 110 for connection purposes. Each of these protrusions 111 may comprise a post or pillar 131 (for instance a copper pillar) and a solder cap 133 of a solderable material (for instance AgSn or another solderable alloy) on top of the pillar 131.

For instance, the mold layer 102 may be already cured (i.e. may be completely cross-linked or polymerized) in the condition shown in FIG. 1. Preferably, the material of the mold layer 102 is configured so that it had adhesive properties in an uncured state. This material property simplifies a connection between mold layer 102 and semiconductor die 104 during the manufacturing process and before curing.

As shown in a detail 135 of FIG. 1, the mold layer 102 may comprise a resin matrix 150 (for instance made of epoxy resin) and filler particles 152 embedded in the resin matrix 150. The filler particles 152 may be made of metal oxide (for instance aluminum oxide, calcium oxide, magnesium oxide, manganese oxide), silicon oxide and/or a ceramic material (such as aluminum nitride). Also other filler particles 152 may be used for adjusting the electric conductivity, the thermal conductivity, the coefficient of thermal expansion, etc., of the mold layer 102.

For example, the electronic component 100 shown in FIG. 1 may be used as such, for instance may be surface mounted on a printed circuit board (PCB), not shown. It is however also possible that the electronic component 100 is encapsulated to form a package 120, as shown for instance in FIG. 10 and FIG. 11.

FIG. 2 to FIG. 9 illustrate cross-sectional views of structures obtained during carrying out a method of manufacturing electronic components 100 according to an exemplary embodiment.

Figure 2:
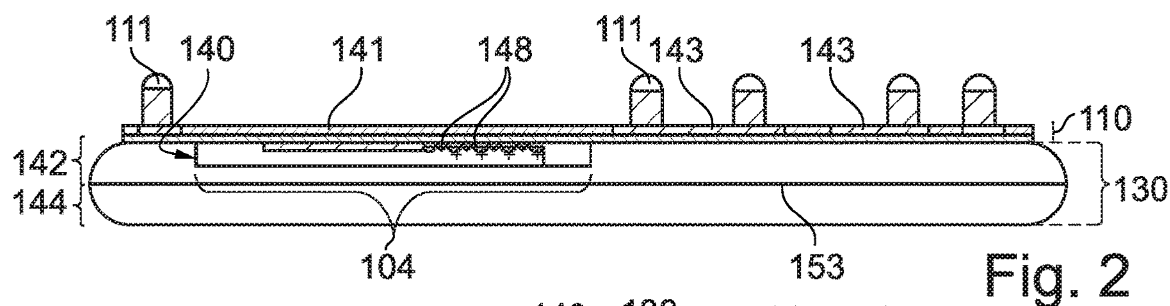
FIG. 2 to FIG. 9 illustrate cross-sectional views of structures obtained during carrying out a method of manufacturing electronic components on wafer level according to an exemplary embodiment.

Referring to FIG. 2, a fully processed device wafer 130 is shown. Wafer 130 is a semiconductor wafer comprising a plurality of still integrally connected semiconductor dies 104 arranged side-by-side along a horizontal direction of FIG. 2. Wafer 130 is configured as a Silicon-On-Insulator (SOI) wafer. This means that the wafer 130 has a layer of low ohmic first portions 142 of its integrally connected semiconductor dies 104. This layer of first portions 142 is made of crystalline silicon material with relatively high electric conductivity. Moreover, the wafer 130 has a layer of high ohmic second portions 144 of the integrally connected semiconductor dies 104. The layer of second portions 144 may be partially made of non-crystalline silicon material with relatively low electric conductivity. Each of the plurality of semiconductor dies 104 thus has a low ohmic first portion 142 and a high ohmic second portion 144, wherein the first portion 142 has an active area 140. For illustration purposes, FIG. 2 does not reflect the real thickness properties of the portions 142, 144 true to scale. In reality, the thickness of first portion 142 is much smaller than the thickness of the second portion 144 (see description concerning FIG. 1).

Moreover, the layer of first portions 142 may be separated from the layer of second portions 144 by an electrically insulating layer 153, for instance a silicon oxide layer. Thus, wafer 130 is a Silicon-On-Insulator wafer.

Wafer 130 comprises the multiple still integrally connected semiconductor dies 104 each with an active area 140, although only one semiconductor die 104 is shown in FIG. 2. The active area 140 of each semiconductor die 104 has monolithically integrated circuit elements 148 (for instance transistors, diodes, RF circuit elements, etc.) connected to electrically conductive pads 146 (not shown in FIG. 2, see FIG. 1) of back end of line (BEOL) structure 110. Each active area 140 forms part of the assigned low ohmic first portion 142 and may have a thickness L for instance in a range from 100 nm to 200 nm.

The BEOL structures 110 are provided on an upper main surface of the semiconductor wafer 130. Electrically conductive protrusions 111 protrude upwardly from the BEOL structures 110 for each of the still integrally connected semiconductor dies 104.

Figure 3:
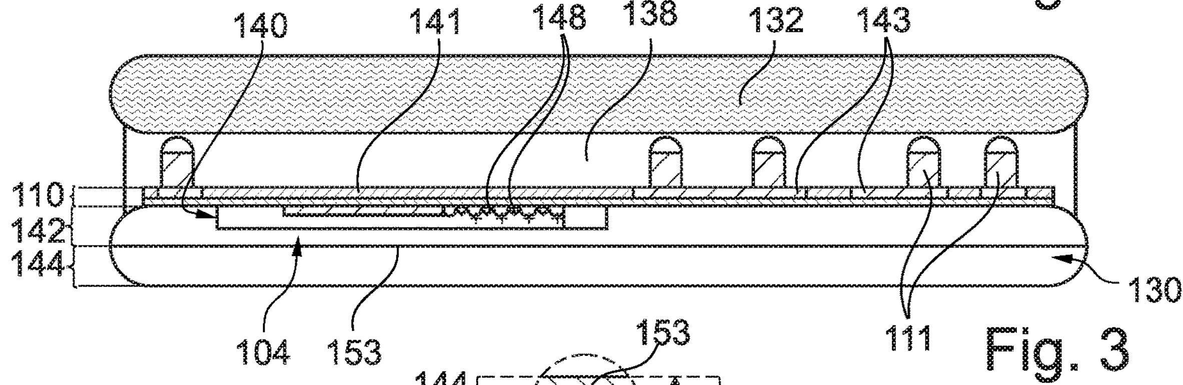

In order to obtain the structure illustrated in FIG. 3, the electrically conductive protrusions 111 are embedded in a temporary adhesive structure 138. Adhesive structure 138 may be made of thermoplastic adhesive or a UV- (ultraviolet radiation) hardenable adhesive which adheres under surface tension and can be removed later without residues. Adhesive structure 138 may thus be a non-permanent adhesive.

Furthermore, a carrier wafer 132 (for instance made of glass) is temporarily connected to the semiconductor wafer 130 with the adhesive structure 138 in between.

Hence, FIG. 3 illustrates assembly of device wafer 130 to reversible carrier wafer 132 by the adhesive structure 138.

Figure 4:
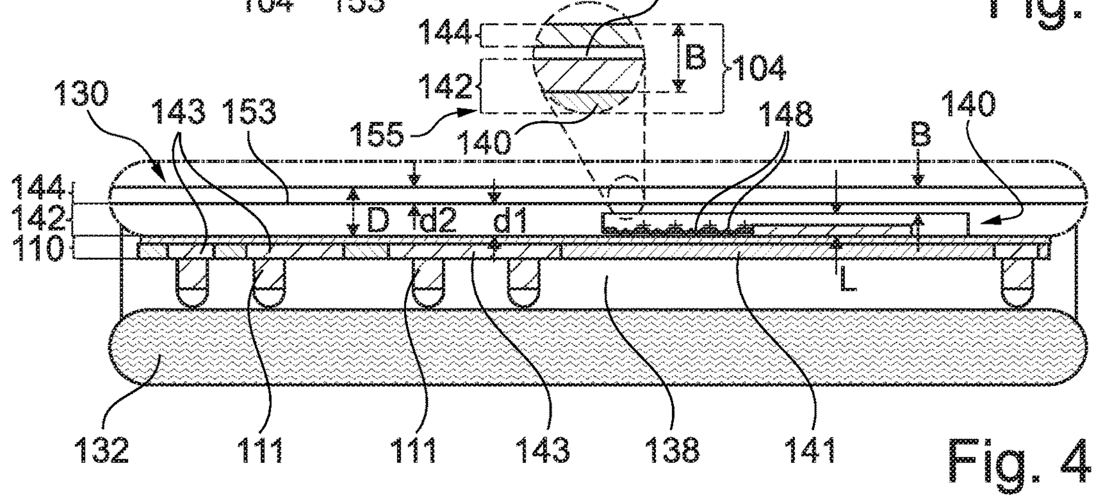

Referring to FIG. 4, the structure shown in FIG. 3 is shown turned upside down and is thinned at an exposed side of the device wafer 130. In order to obtain the structure shown in FIG. 4, thinning of the semiconductor wafer 130 is carried out by removing part of the material of the high ohmic second portion 144. In the shown embodiments, neither material of the electrically insulating layer 153 nor of the low ohmic first portion 142 is removed. This is illustrated in a detail 155.

In other words, FIG. 4 shows the result of thinning of the device wafer 130 from the backside to a target silicon thickness D of for instance 25 μm. Said thinning may be accomplished for example by a mechanical treatment and/or a chemical-mechanical treatment and/or a chemical wet etching treatment.

Figure 5:
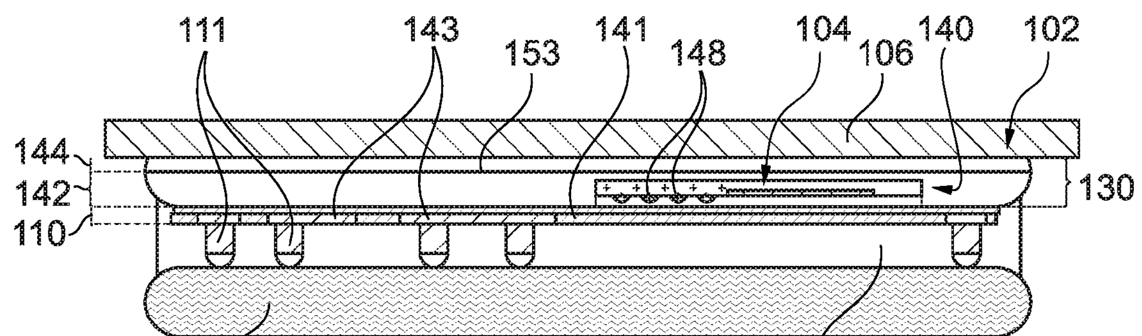

Referring to FIG. 5, a mold layer 102, which is here configured as a mold film or foil 106, is attached to an exposed surface of the second portion 144 after the thinning. Mold layer 102 may be connected to the wafer 130 for instance by lamination, compression molding, transfer molding or adhesion using a separate adhesive layer (not shown in FIG. 5, compare reference sign 154 in FIG. 1).

Thus, a molding tape or molding foil 106 is assembled or mounted as a backside protection foil to the backside of the wafer 130. Also, the application of a mold compound instead of or additionally to the provision of the mold foil 106 is possible in other embodiments. Furthermore, further procedures may be carried out subsequently, such as curing and/or annealing.

Figure 6:
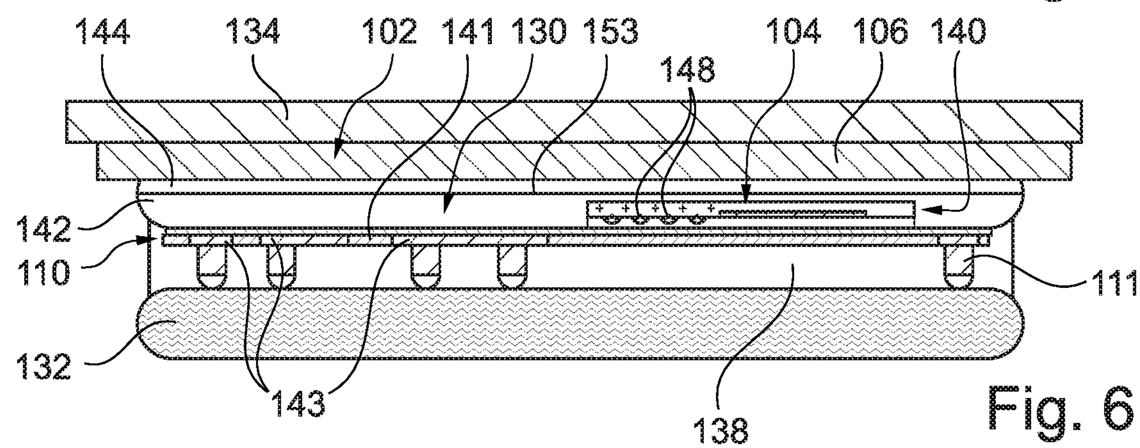

As shown in FIG. 6, it is possible to temporarily connect a dicing foil 134 to the mold layer 102. In one embodiment, the dicing foil 134 may be attached to the mold layer 102 on wafer 130 after having carried out the process according to FIG. 5. Hence, FIG. 6 illustrates assembly or mounting of dicing tape or foil 134 to the back-die protection mold foil 106 which has already previously been connected to the device wafer 130.

In another embodiment, it may be advantageously possible to provide foils 106, 134 as a preformed double foil which is then connected in one process to the (thinned) wafer 130 (not shown).

Figure 7:
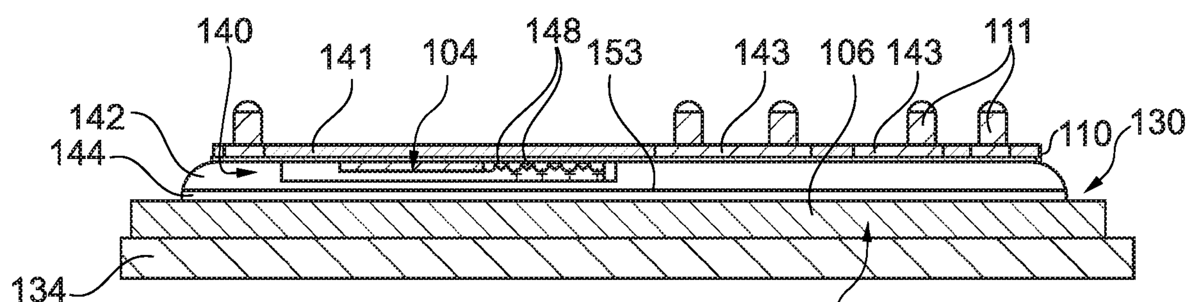

In order to obtain the structure illustrated in FIG. 7, the (optional) carrier wafer 132 may then be removed from the semiconductor wafer 130, since it is no more necessary as a support for handling. Also the non-permanent adhesive structure 138 may then be removed, preferably without residues.

Hence, the carrier wafer 130 and the adhesive structure 138 may be detached for preparing subsequent singularization of manufactured electronic components 100.

Figure 8:
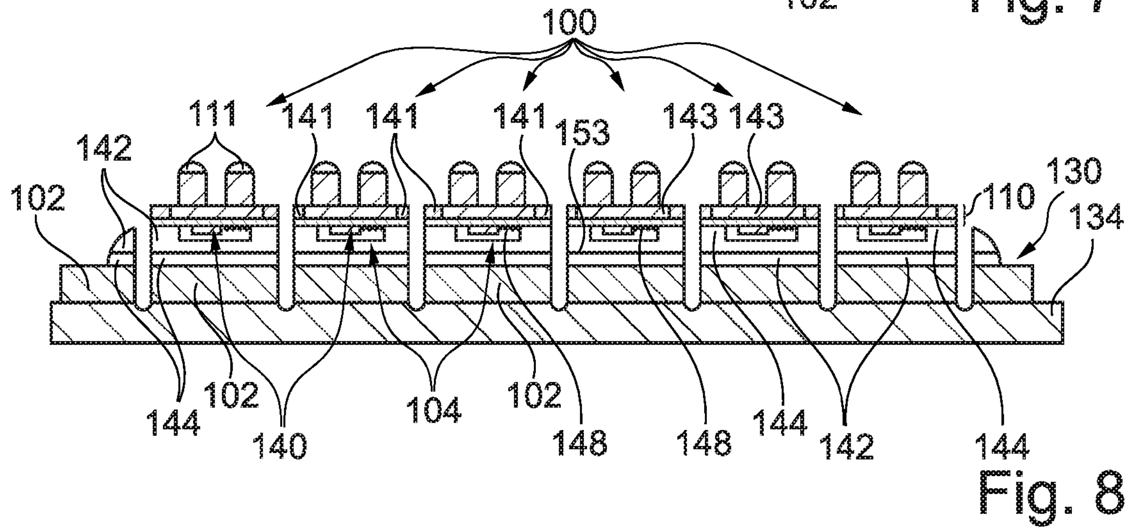

Referring to FIG. 8, the semiconductor wafer 130 on the mold layer 102 may then be separated into a plurality of separate electronic components 100 each comprising one (or more) of the semiconductor dies 104, a portion of the mold layer 102 as well as a portion of the BEOL structure 110 and one or more protrusions 111. For instance, said separating may be accomplished by laser ablation. More generally, singularization may be done by mechanically sawing, laser sawing and/or etching. As shown, the dicing foil 134 still holds the singularized electronic components 100 together.

Thus, FIG. 8 illustrates separation of the individual semiconductor chips or dies 104 by mechanical sawing, laser sawing or a combination of laser sawing/ablation and mechanical sawing.

Figure 9:
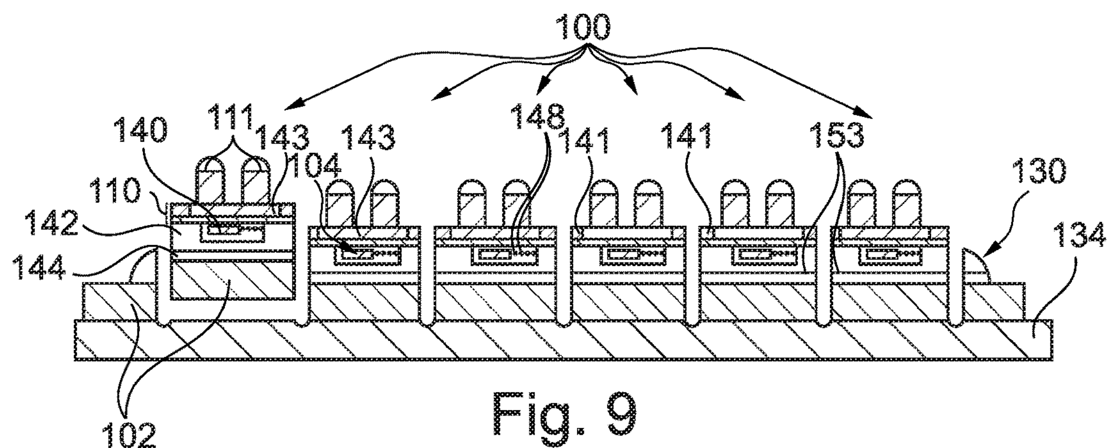

As shown in FIG. 9, it is then possible to detach the electronic components 100 from the dicing foil 134, for instance by a pick and place tool (not shown).

Figure 10:
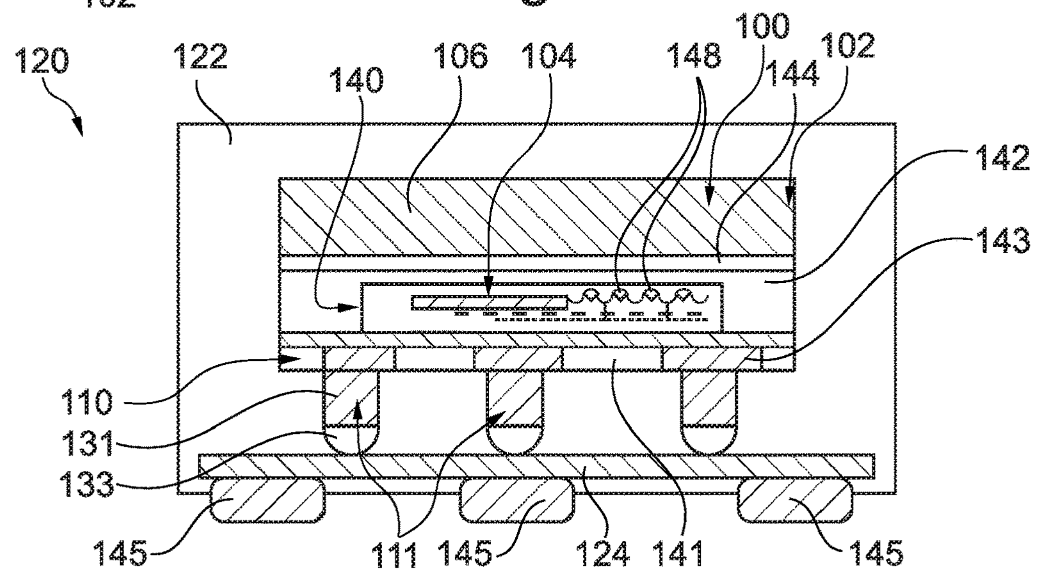
FIG. 10 illustrates a cross-sectional view of a package according to an exemplary embodiment.
Figure 11:
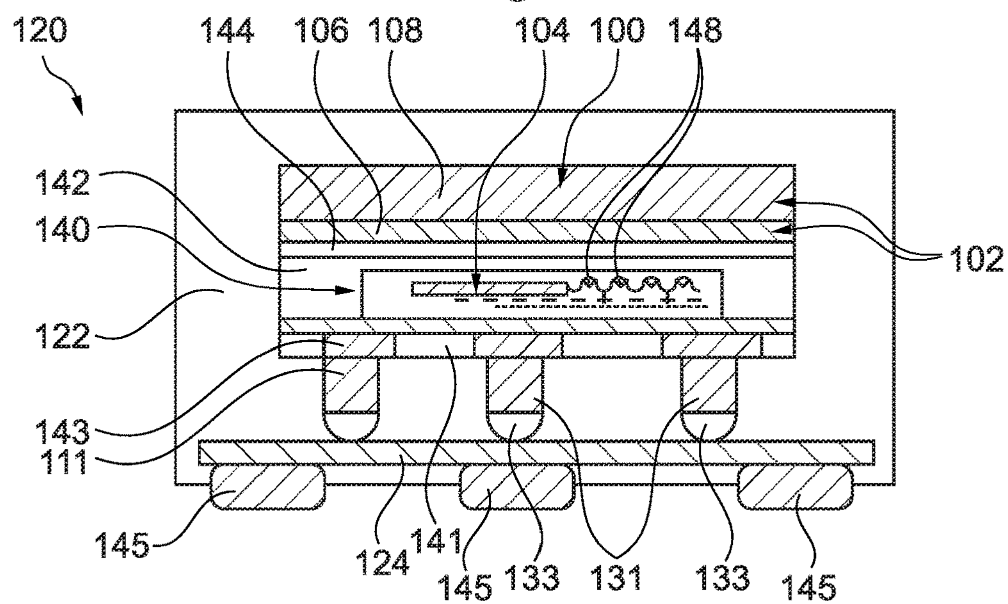
FIG. 11 illustrates a cross-sectional view of a package according to another exemplary embodiment.

In other words, the singularization process may be followed by a pick and place procedure for bringing the individual electronic components 100 to a destination (for instance to an encapsulation tool) for subsequently creating a package 120 as shown in FIG. 10 or FIG. 11.

FIG. 10 illustrates a cross-sectional view of a package 120 according to an exemplary embodiment.

The package 120 may be obtained by encapsulating, in particular overmolding, an electronic component 100 (which can be constructed in a similar way as shown in FIG. 1 or FIG. 9) by a mold-type encapsulant 122 after the singularization process illustrated in FIG. 8 and FIG. 9. More specifically, encapsulant 122 may be a mold compound. For instance, the encapsulant 122 may be formed by injection molding, compression molding, transfer molding, etc.

The illustrated package 120 thus comprises an electronic component 100 having dielectric (for instance mold) layer 102 and semiconductor die 104, as well as BEOL structure 110 and protrusions 111. For instance, the dielectric layer 102 is made of a temperature curable material. The semiconductor die 104 comprises a crystalline silicon low ohmic first portion 142 and a high ohmic second portion 144 which may be made of a silicon material (for instance at least partially of crystalline, polycrystalline and/or amorphous silicon material) having a lower electric conductivity than the material of the first portion 142. As shown, the first portion 142 has an active area 140 with monolithically integrated circuit elements 148. The second portion 144 is arranged directly on (i.e. above or under) the dielectric layer 102. Mold-type encapsulant 122 encapsulates the electronic component 100 as well as a carrier 124. The mold materials of the encapsulant 122 on the one hand and the dielectric layer 102 on the other hand may be different.

As already mentioned, the package 120 comprises an electrically conductive carrier 124, which can be of a leadframe type, for instance embodied as a patterned copper sheet. Alternatively, the carrier 124 may be a printed circuit board (PCB), Direct Copper Bonding (DCB) substrate, Direct Aluminum Bonding (DAB) substrate, etc.

The carrier 124 is partially encapsulated by the encapsulant 122 and is partially exposed with respect to the encapsulant 122. Electrically conductive connection structures 145 allow to electrically connect the package 120 with an electronic periphery by soldering, for instance with a mounting base (such as a printed circuit board (PCB), not shown) on which the package 120 may be mounted. Furthermore, the carrier 124 is electrically connected with the electronic component 100 by soldering the solder caps 133 of the protrusions 111 of the electronic component 100 onto an upper surface of the plate-shaped carrier 124. As a result, the electrically conductive BEOL structure 110 on one main surface of the semiconductor die 104 is connected to the carrier 124 via the protrusions 111.

The package 120 according to FIG. 10 may thus be formed based on an ultra-thin chip without carrier plate in package with a mold foil 106 as tiny support only.

FIG. 11 illustrates a cross-sectional view of a package 120 according to another exemplary embodiment.

The embodiment of FIG. 11 differs from the embodiment of FIG. 10 in particular in that, according to FIG. 11, the dielectric layer 102 is a double mold layer composed of a mold plate 108 and a mold foil 106. The mold foil 106 is arranged between the mold plate 108 and the semiconductor die 104.

Hence, the package 120 according to FIG. 11 may be formed based on an ultra-thin chip with a mold foil 106 and an additional mold plate 108 as additional support.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic component configured to be encapsulated to form a package, the electronic component comprising:
- a mold layer; and
- a semiconductor die comprising a low ohmic semiconductor portion and a high ohmic semiconductor portion,
- wherein the low ohmic semiconductor portion has an active area and the high ohmic semiconductor second portion is arranged on the mold layer.

2. The electronic component of claim 1, wherein the mold layer comprises a mold foil, and/or wherein the mold layer comprises a mold plate.

3. The electronic component of claim 1, wherein the mold layer is a double mold layer.

4. The electronic component of claim 1, wherein the mold layer comprises a resin matrix and filler particles in the resin matrix, wherein the resin matrix comprises epoxy resin, and wherein the filler particles comprise metal oxide.

5. The electronic component of claim 1, wherein the active area has at least one transistor and/or at least one diode.

6. The electronic component of claim 1, further comprising an adhesive layer between the mold layer and the semiconductor die.

7. The electronic component of claim 1, wherein the active area has a thickness of less than 1 μm.

8. The electronic component of claim 1, wherein the semiconductor die has unprocessed semiconductor material with a thickness of less than 150 μm.

9. The electronic component of claim 1, wherein the semiconductor die has a thickness in a range from 1 μm to 200 μm.

10. The electronic component of claim 1, wherein:
- the high ohmic semiconductor portion comprises a semiconductor material having an electric resistivity of at least 500 Ωcm; and/or
- the low ohmic semiconductor portion comprises a semiconductor material having an electric resistivity of less than 100 Ωcm; and/or
- the semiconductor die is a silicon-on-insulator die; and/or
- the semiconductor die includes at least one material selected from the group consisting of silicon, germanium, gallium nitride, gallium arsenide, indium phosphide, silicon carbide, sapphire, diamond, and diamond-like coating.

11. The electronic component of claim 1, further comprising an electrically conductive back end of line structure on a main surface of the semiconductor die opposing another main surface of the semiconductor die on the mold layer.

12. The electronic component of claim 11, wherein the back end of line structure is directly connected to the active area of the semiconductor die.

13. The electronic component of claim 11, further comprising at least one electrically conductive protrusion protruding beyond the back end of line structure.

14. The electronic component of claim 1, wherein the semiconductor die is a high frequency semiconductor die.

15. The electronic component of claim 1, wherein the mold layer is cured and has adhesive properties in an uncured state.

16. A package, comprising:

the electronic component of claim 1, the electronic component comprising a dielectric layer as the mold layer; and an encapsulant encapsulating at least part of the electronic component.

17. The package of claim 16, wherein the dielectric layer comprises a mold foil, and/or a curable layer, and/or a temperature curable layer.

18. The package of claim 16, further comprising:

a carrier at least partially encapsulated by the encapsulant and electrically connected with the electronic component; and/or an electrically conductive back end of line structure on a main surface of the semiconductor die and connected to an at least partially electrically conductive carrier, wherein the encapsulant is a mold compound having different material properties than the dielectric layer.

19. The electronic component of claim 1, wherein the low ohmic semiconductor portion is a crystalline silicon portion, and wherein the high ohmic semiconductor portion is a high resistance silicon portion.

20. The electronic component of claim 1, wherein the low ohmic semiconductor portion and the high ohmic semiconductor portion are separated by a dielectric layer in between.

21. The electronic component of claim 1, wherein the low ohmic semiconductor portion has an electric resistivity in a range from 1 Ωcm to 10 Ωcm, and wherein the high ohmic semiconductor portion has an electric resistivity of at least 500 Ωcm.

22. A method of manufacturing electronic components, the method comprising:

providing a semiconductor wafer comprising a plurality of semiconductor dies each comprising a low ohmic semiconductor portion and a high ohmic semiconductor portion, wherein each of the low ohmic semiconductor portions has an active area;

arranging the high ohmic semiconductor portions on a mold layer; and thereafter separating the semiconductor wafer and the mold layer into a plurality of separate electronic components each comprising at least one of the semiconductor dies and a portion of the mold layer.

23. The method of claim 22, further comprising:

temporarily connecting a carrier wafer to the semiconductor wafer before the arranging, and removing the carrier wafer from the semiconductor wafer before the separating; and/or thinning the semiconductor wafer by removing material at least of the high ohmic semiconductor portions, before connecting the semiconductor wafer to the mold layer; and/or temporarily connecting a dicing foil to the mold layer before or after the arranging, and removing the dicing foil from the electronic components during or after the separating; and/or embedding electrically conductive protrusions on an electrically conductive back end of line structure on a main surface of the semiconductor wafer in a temporary adhesive structure, the temporary adhesive structure connecting the semiconductor wafer with a carrier wafer; and/or separating by at least one of mechanically sawing, laser sawing and etching; and/or encapsulating each electronic component by an encapsulant after the separating.

* * * * *

UNITED STATES PATENT AND TRADEMARK OFFICE

CERTIFICATE OF CORRECTION

PATENT NO. : 11,605,572 B2
APPLICATION NO. : 17/237143
DATED : March 14, 2023
INVENTOR(S) : D. Porwol et al.

It is certified that error appears in the above-identified patent and that said Letters Patent is hereby corrected as shown below:

In the Claims

Column 14, Line 23 (Claim 1, Line 8), please change “semiconductor second” to -- semiconductor --.

Signed and Sealed this
Ninth Day of May, 2023

Katherine Kelly Vidal

Katherine Kelly Vidal
*Director of the United States Patent and Trademark Office*